(12) United States Patent
Walther et al.

(10) Patent No.: US 7,638,781 B2
(45) Date of Patent: Dec. 29, 2009

(54) LOCAL PRESSURE SENSING IN A PLASMA PROCESSING SYSTEM

(75) Inventors: Steven R. Walther, Andover, MA (US); Harold M. Persing, Westbrook, ME (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 246 days.

(21) Appl. No.: 11/860,333

(22) Filed: Oct. 22, 2007

(65) Prior Publication Data

US 2009/0101848 A1 Apr. 23, 2009

(51) Int. Cl.
*A61N 5/00* (2006.01)
(52) U.S. Cl. .................................. 250/492.2; 250/492.1
(58) Field of Classification Search .... 250/492.1–492.3
See application file for complete search history.

(56) References Cited

U.S. PATENT DOCUMENTS

| | | | | |
|---|---|---|---|---|
| 4,587,433 A | 5/1986 | Farley | | |
| 5,244,820 A * | 9/1993 | Kamata et al. | | 438/514 |
| 5,760,409 A | 6/1998 | Chen et al. | | |
| 5,969,366 A * | 10/1999 | England et al. | | 250/492.21 |
| 6,288,357 B1 * | 9/2001 | Dyer | | 219/121.41 |
| 6,323,497 B1 | 11/2001 | Walther | | |
| 7,087,913 B2 * | 8/2006 | Goldberg et al. | | 250/492.21 |
| 7,132,672 B2 * | 11/2006 | Walther et al. | | 250/492.3 |
| 7,132,673 B2 * | 11/2006 | Fischione et al. | | 250/492.3 |
| 7,504,623 B2 * | 3/2009 | Fischione et al. | | 250/309 |
| 2005/0082497 A1 * | 4/2005 | Goldberg et al. | | 250/492.21 |
| 2005/0260837 A1 | 11/2005 | Walther et al. | | |
| 2006/0022148 A1 * | 2/2006 | Fischione et al. | | 250/492.21 |
| 2007/0023701 A1 * | 2/2007 | Fishione et al. | | 250/492.21 |

* cited by examiner

*Primary Examiner*—David A Vanore
*Assistant Examiner*—Andrew Smyth

(57) ABSTRACT

A plasma processing system includes a process chamber, a source configured to generate a plasma in the process chamber, a platen configured to support a workpiece in the process chamber, and a pressure sensor positioned adjacent to the workpiece. The pressure sensor is configured to monitor a local pressure adjacent to the workpiece. A method includes generating a plasma in a process chamber, supporting a workpiece in the process chamber, and monitoring a local pressure adjacent to the workpiece with a pressure sensor positioned adjacent to the workpiece.

10 Claims, 4 Drawing Sheets

LOCAL PRESSURE SENSING IN A PLASMA PROCESSING SYSTEM

FIELD

This disclosure relates to workpiece processing systems, and more particularly to outgassing rate detection in a workpiece processing system.

BACKGROUND

A workpiece processing system may include, but not be limited to, plasma processing systems such as doping, etching, and deposition systems. A workpiece processing system may also include a beam-line doping system such as a beam-line ion implanter. As a workpiece in such systems is treated, outgassing may occur from the workpiece. Such outgassing can lead to unstable and/or non-repeatable conditions. Therefore, it is desirable to sense and control such outgassing.

For instance, two types of workpiece processing systems include plasma doping and beam-line ion implanters. In a plasma doping ion implanter, a source may generate plasma within a process chamber. A platen is positioned in the process chamber for supporting a workpiece, and ions may be accelerated from the plasma into the wafer. In a beam-line ion implanter, a desired impurity material is ionized in an ion source, the ions are accelerated to form an ion beam of prescribed energy, and the ion beam is directed at a front surface of the workpiece.

In both the plasma doping and beam-line ion implanters, it may be desirable to operate the ion implanter at a relatively high dose rate in order to increase throughput. However, operating at such relatively high dose rates can exacerbate outgassing from the workpiece, e.g., a semiconductor wafer or wafer in one instance. Outgassing from the wafer may occur when ions strike films or layers on the wafer such as a photoresist layer. A photoresist layer is used to mask selected areas of the wafer surface so ions are implanted only in the unmasked areas. During ion implantation, the energetic ions may break up chemical bonds within the photoresist layer. As a result, outgassing byproducts such as volatile organic chemicals and/or other particles may be released. This may be referred to generally in the art as "outgassing," or "photoresist outgassing" when the outgassing is attributable to the photoresist layer.

High rates of outgassing from the wafer in ion implanters can lead to unstable and/or non-repeatable implant conditions. High rates of outgassing can also contribute to contamination in ion implanters as the energetic ions collide with the outgassing byproducts. In addition, in plasma doping ion implanters, outgassing byproducts can lead to arcing in the process chamber that can damage the devices being formed on the wafer. Therefore, it is desirable to sense a parameter representative of an outgassing rate. One conventional parameter that may be sensed in plasma doping ion implanters is global pressure in the process chamber sensed by a pressure sensor positioned relatively far away from the wafer. However, this pressure sensor has accuracy and time delay drawbacks.

Accordingly, there is a need to provide another technique for outgassing rate detection that overcomes the above-described inadequacies and shortcomings.

SUMMARY

According to a first aspect of the disclosure, a workpiece processing system is provided. The workpiece processing system includes a platen configured to support a workpiece, a source configured to provide an electromagnetic wave proximate a front surface of the workpiece, and a detector configured to receive at least a portion of the electromagnetic wave and provide a detection signal representative of an outgassing rate from the workpiece of outgassing byproducts.

According to another aspect of the disclosure, a method of detecting outgassing is provided. The method includes providing an electromagnetic wave proximate a front surface of a workpiece, receiving at least a portion of the electromagnetic wave, and providing a detection signal representative of an outgassing rate from the workpiece of outgassing byproducts.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
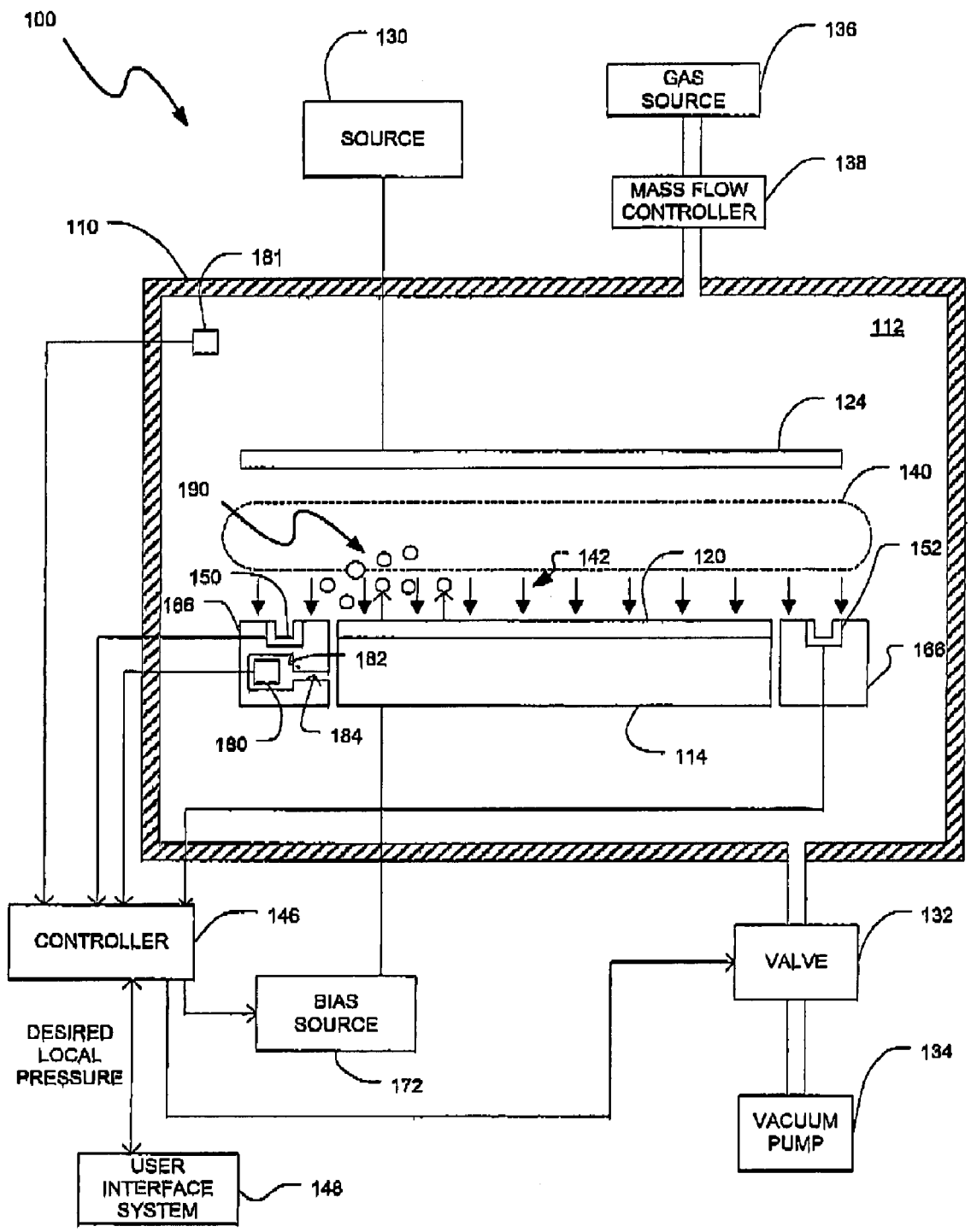
FIG. 1 is a block diagram of a workpiece processing system consistent with the disclosure.

FIG. 1 is a block diagram of a workpiece processing system 100 consistent with an embodiment of the disclosure. The workpiece processing system 100 may include, but not be limited to, doping systems, etching systems, and deposition systems. Doping systems may include a plasma doping ion implanter or a beam-line ion implanter. The workpiece processing system 100 includes a platen 114 to support a workpiece 120. The workpiece processing system 100 also includes a source 160, a detector 162, a controller 146, a user interface system 148, and rate components 151. The source 160 is configured to provide an electromagnetic wave 165 proximate a front surface 122 of the workpiece 120. The source 160 may be a light source to emit a light wave or a microwave source to emit a microwave. The light source may be a laser, a light-emitting diode, or other light source known in the art. The light wave may have a frequency in the ultraviolet spectrum, the visible spectrum, and the infrared spectrum. The light source may provide a pulsed or continuous light wave. The microwave may have a frequency in the microwave spectrum. The detector 160 receives at least a portion of the electromagnetic wave 165 depending on the outgassing rate of outgassing byproducts 190 from the workpiece 120. The source 160 may be positioned at one end of the workpiece 120, while the detector 162 may be positioned on an opposing end of the workpiece 120. The detector may be a light detector or a microwave detector. The light detector may by a photodiode, a photoresistor, or other light detector known in the art. The light detector may also include a collimator to redirect received light waves to the same area of the light detector.

The controller 146 can be or include a general-purpose computer or network of general-purpose computers that may be programmed to perform desired input/output functions. The controller 146 can also include other electronic circuitry or components, such as application specific integrated circuits, other hardwired or programmable electronic devices, discrete element circuits, etc. The controller 146 may also include communication devices, data storage devices, and software. The user interface system 148 may include, but not be limited to, devices such as touch screens, keyboards, user pointing devices, displays, printers, etc. to allow a user to input commands and/or data and/or to monitor the workpiece processing system 100 via the controller 146.

The rate components 151 can include differing components known in the art to control a rate of particles 141 directed to the workpiece 120. When the workpiece processing system 100 is an ion implanter, the rate components 151 can include dose rate components to control the rate of ions directed to the workpiece 120. For a beam-line ion implanter, the dose rate components may include an ion source, focusing elements such as lenses, a mass resolving slit, a scanner, and/or other beam line components known in the art. The dose rate components in a beam-line ion implanter may change the quantity of ions/second generated and/or reduce a cross sectional size of the ion beam having the same number of ions/second generated since dose rate may be given by ions/second/cm$^2$. For plasma doping ion implanters, the dose rate components may include a source to change the plasma density, a biasing source to change the rate at which ions are accelerated from the plasma towards the wafer, and/or other components known to those skilled in the art.

In operation, the workpiece processing system 100 may direct particles 141 towards the workpiece 120. The particles 141 may break up chemical bonds within a layer, e.g., a photoresist layer 121, of the workpiece 120. As a result, outgassing byproducts 190 such as volatile organic chemicals and/or other particles may be released from the workpiece 120. The outgassing byproducts 190 may include photoresist outgassing byproducts released from the photoresist layer 121. The photoresist byproducts may include, but not be limited to, carbon compounds, water vapor, hydrogen, and nitrogen.

The electromagnetic wave 165 may be partially deflected and/or absorbed by the released outgassing byproducts 190. The amount of the electromagnetic wave deflected and/or absorbed depends on the outgassing rate of the outgassing byproducts 190. Therefore, the intensity of the received electromagnetic wave by the detector 162 may be reduced compared to a nominal intensity in the presence of no outgassing. The controller 146 may determine the amount of reduction and correlate the same to an outgassing rate.

The source 160, the detector 162, and the frequency of the electromagnetic wave 165 may be selected to maximize deflection and/or absorption by the expected outgassing byproducts 190. In one embodiment, the expected outgassing byproducts 190 may include carbon compounds such as $CH_4$. In this instance, the source 160 may be a light source and the electromagnetic wave 165 may be a light wave having a frequency in the infrared frequency spectrum. The detector 162 may be a light detector and the detection signal is representative of an outgassing rate of the carbon compounds. In one specific example, the wavelength of the light wave was selected at 3.392 microns to detect $CH_4$.

In another embodiment, the expected outgassing byproducts 190 may include water vapor. In this instance, the source 160 may be a microwave source and the electromagnetic wave 165 may be a microwave. The detector 162 may be a microwave detector and the detection signal is representative of an outgassing rate of the water vapor. In one specific example, the wavelength of the microwave was selected at 12 centimeters (2.45 GHz frequency) to detect water vapor.

In yet another embodiment, the expected outgassing byproducts 190 may include hydrogen. In this instance, the source 160 may be a light source and the electromagnetic wave 165 may be a light wave having a frequency in the ultraviolet frequency spectrum. The detector 162 may be a light detector and the detection signal is representative of an outgassing rate of the hydrogen. In one specific example, the wavelength of the light wave was selected at 1216 angstroms to detect hydrogen atoms.

The frequency range of the electromagnetic 165 wave may be selected to maximize deflection and/or absorption by the expected outgassing byproducts 190. The detector 162 may therefore sense a decrease in the intensity of the received electromagnetic wave depending on the outgassing rate of the outgassing byproducts 190 and provide a detection signal to the controller 146. The controller 146 may adjust the rate of the particles 141 in response to the detection signal. For example, in an ion implanter the controller 146 may lower a dose rate of ions directed towards the workpiece 120 in response to an excessive outgassing rate and increase the dose rate to a maximum level in response to a modest outgassing rate.

Figure 2:
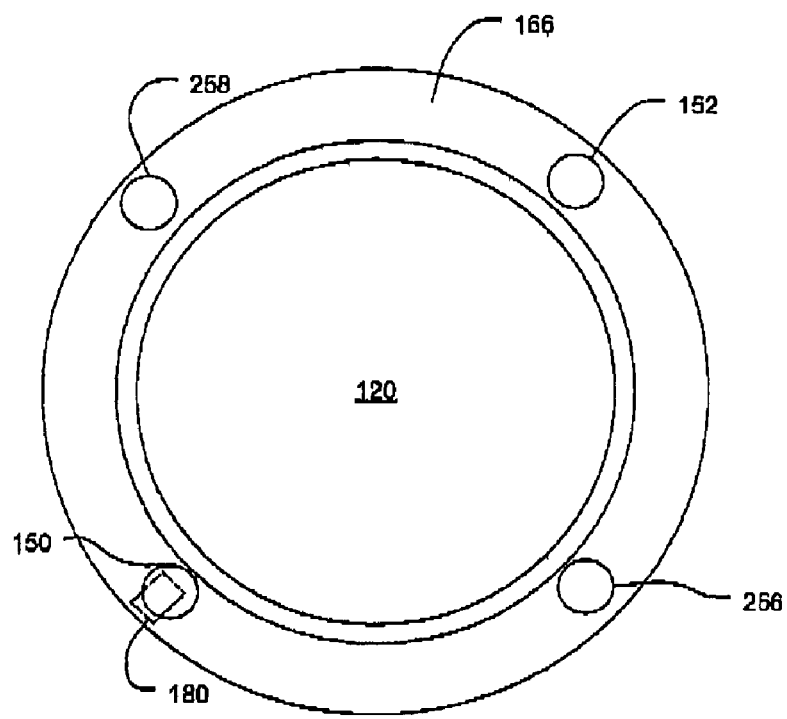
FIG. 2 is a block diagram of one embodiment of a plasma doping ion implanter having a light source and light detector positioned within a process chamber.

FIG. 2 is a block diagram of one embodiment of a plasma doping ion implanter 200 consistent with the workpiece processing system 100 of FIG. 1 where the source 160 is a light source 260, the detector 162 is a light detector 262 and the electromagnetic wave 165 is a light wave 265. The plasma doping ion implanter 200 may include a process chamber 210 defining an enclosed volume 212. In this embodiment, the light source 260 and light detector 262 may be positioned within the process chamber 210. The platen 114 may be positioned within the process chamber 210 to provide a holding surface for holding the workpiece 120. In one instance, the workpiece 120 may be a semiconductor wafer having a disk shape. The workpiece 120 may, for example, be clamped to a flat surface of the platen 114 by electrostatic or mechanical forces. In one embodiment, the platen 114 may include conductive pins (not shown) for connection to the workpiece 120.

There are differing methods to generate a plasma 240 within the process chamber 210. In one embodiment, a source 230 may cooperate with the anode 224 to generate the plasma 240. The source 230 may be a high voltage power source to provide high voltage pulses to the anode 224. In other embodiments, the source 230 may be a RF source such as an RF power supply to supply RF power to one or more antennas (not illustrated) to generate the plasma 240 in the process chamber 210. Other sources and configurations for generating the plasma 240 in the process chamber 210 will be known to those skilled in the art. The plasma 240 may include a plasma sheath 242 in the region between the plasma 240 and the workpiece 120.

The plasma doping ion implanter 200 may also include a bias source 272 electrically coupled to the platen 114 to bias the platen 114 to accelerate ions from the plasma 240 into the workpiece 120. The bias source 272 may be a DC pulsed power supply, an RF power supply, or other power supply known by those skilled in the art. When the bias source 272 is a DC pulsed power supply, the duty factor may be selected to provide a desired dose rate. A negative voltage pulse would accelerate positive ions from the plasma 240 towards the wafer 120. The enclosed volume 212 of the process chamber 210 may be coupled thought a controllable valve 232 to a vacuum pump 234. A gas source 236 may be coupled through a mass flow controller 238 to the chamber 210.

A shield ring 266 may be disposed around the platen 114. As is known in the art, the shield ring 266 may be biased to improve the uniformity of implanted ion distribution near the edge of the workpiece 120. Faraday sensors such as Faraday cups 250, 252 may also be positioned in an associated recess of the shield ring 266. The Faraday sensors monitor ion current and may input a signal to the controller 146 representative of the dose rate. The controller 146 may process a signal from the Faraday sensors 250, 252 as well as the light detection signal from the light detector 262 to determine ion dose. For clarity of illustration, the controller 146 is illustrated as providing only an output signal to the bias source 172. Those skilled in the art will recognize that the controller 146 may provide output signals to other components of the plasma doping ion implanter 200 and receive input signals from the same.

In operation, the gas source 236 supplies an ionizable gas containing a desired dopant for implantation into the workpiece 120. Examples of ionizable gas include, but are not limited to, $BF_3$, $N_2$, Ar, $PH_3$, $AsH_3$, $B_2H_6$, $H_2$, Xe, $SIH_4$, $SIF_4$, $GeH_4$, $GeF_4$, $CH_4$, $CF_4$, $AsF_5$, $PF_3$, and $PF_5$. The mass flow controller 238 regulates the rate at which gas is supplied to the process chamber 210. The source 230 may generate the plasma 240 within the process chamber 210, and the bias source 272 may bias the platen 114 to accelerate ions from the plasma 240 into the workpiece 120. The energetic ions may cause outgassing byproducts 190 to be released from the wafer. The outgassing byproducts may include, but not be limited to, carbon compounds, water vapor, hydrogen, and nitrogen. The released outgassing byproducts 190 may absorb and/or deflect at least a portion of the light wave 265 provided by the light source 260. The light source 260 may provide a pulsed or continuous light wave 265. A pulsed light wave permits discrimination versus plasma generated light. The pulsed light wave may be pulsed synchronously with the bias signal provided by the bias source 272 or at higher sampling multiples. The pulsed light wave may therefore improve the signal to noise ratio of the portion of the received light wave.

Regardless of whether the light source 260 provides a pulsed or continuous light wave 265, the light detector 262 may sense a decrease in the intensity of the received light wave 265 depending on the outgassing rate of the outgassing byproducts 190 and provide a detection signal to the controller 146 representative of the same. The controller 146 may compare the actual intensity of the received light signal with a desired or nominal intensity and control the dose rate of the implanter 200 in response thereto. The controller 146 may control the dose rate in one embodiment by controlling the duty factor of a pulsed DC voltage signal provided to the platen 114, e.g., by the bias source 272.

Figure 3:
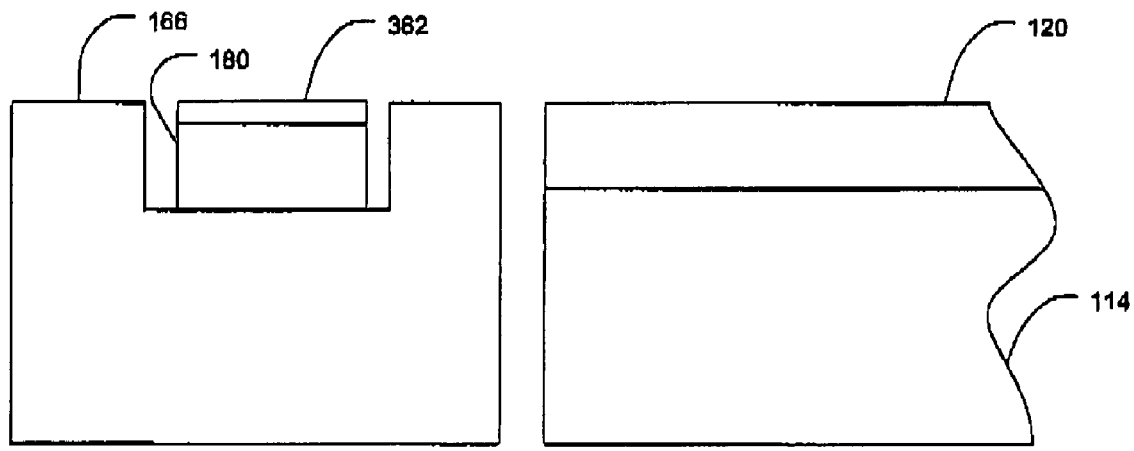
FIG. 3 is a block diagram of another embodiment of a plasma doping ion implanter having a light source and light detector positioned external to the process chamber.

FIG. 3 is a block diagram of another embodiment of a plasma doping ion implanter 300 illustrating the light source 260 and light detector 262 positioned external to the process chamber 210. Selected components of the implanter 300 similar to FIG. 2 have been omitted from the drawing for clarity. A first window 302 is positioned relative to the light source to allow the light wave 265 from the light source to pass. A second window 304 is positioned relative to the light detector 262 to allow the light wave 265, or a portion thereof depending on the amount of light absorbed and/or deflected by the outgassing byproducts 190, to pass. The windows 302, 304 may be fabricated of quartz, glass, or some other transparent material known in the art. Positioning the light source 260 and light detector 262 external to the process chamber 210 protects them from adverse conditions within the interior volume 212 defined by the process chamber 210.

It is possible that over time the first and second windows 302, 304 may become partially opaque due to particle deposits forming thereon. This may reduce transmission of an electromagnetic wave such as a light wave. Such window coating may be compensated for by normalizing the light level received prior to processing the workpiece. For example, the light source 260 may provide a light wave prior to processing and the light detector 262 may quantify the intensity of the received light wave given the current conditions of the windows 302, 304. The ratio of the received signal just prior to processing with the received signal during processing can be utilized to compensate for deposits on the windows 302, 304.

Although FIGS. 2 and 3 illustrate, among other things, the light source 260 and light detector 262 positions relative to the process chamber 210 of plasma doping ion implanters, the light source 260 and light detector 262 could also be similarly positioned relative to another chamber such as an end station chamber of a different plasma processing chamber or a beamline ion implanter.

Figure 4:
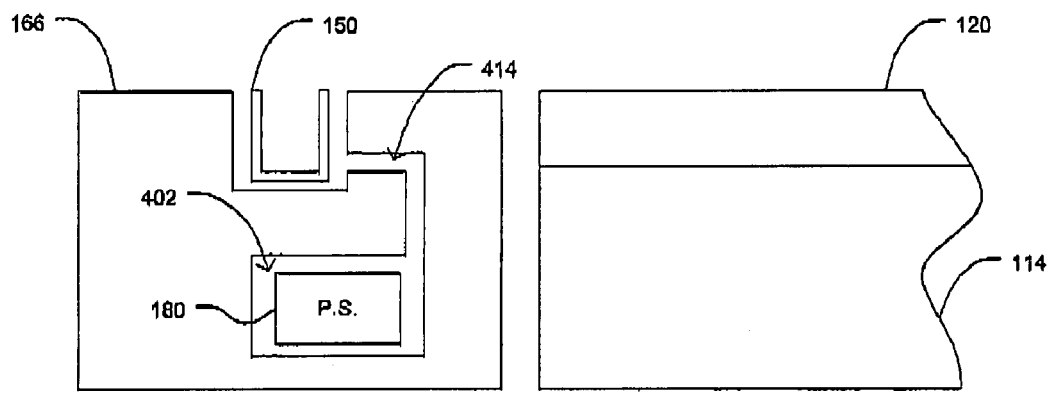
FIG. 4 is a plan view of a semiconductor wafer that may be treated in the systems of FIGS. 1-3.
Figure 5:
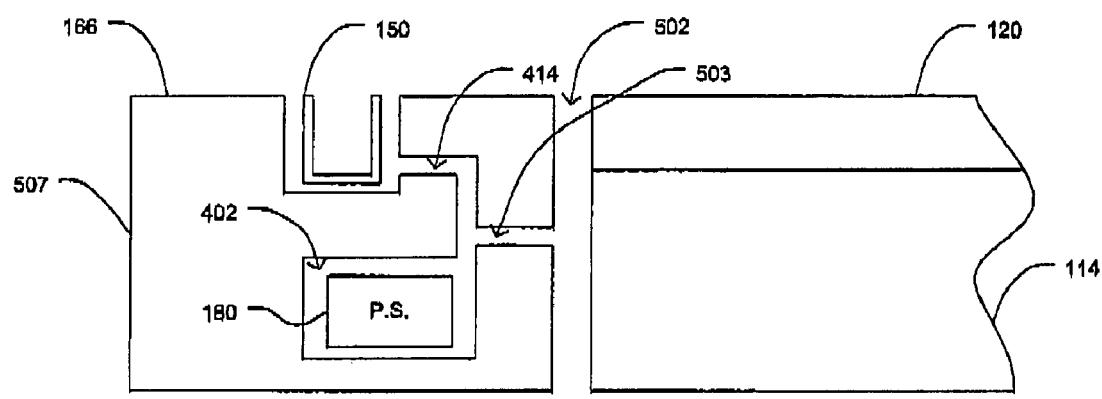
FIG. 5 is a cross sectional view of the semiconductor wafer of FIG. 4.

FIG. 4 is a plan view of a semiconductor wafer 420 having a disk shape and a diameter D1. FIG. 5 is a cross sectional view of the semiconductor wafer of FIG. 4. The semiconductor wafer 420 may have a front surface 422 defining a plane 502. The light wave 265 from the light source may be generally directed along a path 504 parallel to the plane 502. The path 504 may be a distance (x) from the plane 502. In one embodiment, the distance x may be less than or equal to 10% of the diameter D1 of the wafer 420. In this way, the light beam 265 is positioned on a path proximate the front surface 422 of the semiconductor wafer 420 to intercept outgassing byproducts 190 released from the same. For example, with a 300 mm diameter semiconductor wafer, the light beam 265 may be positioned a distance (x) from the semiconductor wafer of less than or equal to 30 mm. This positioning also enables the light wave to pass through the plasma sheath 242 in a plasma doping ion implanter.

Figure 6:
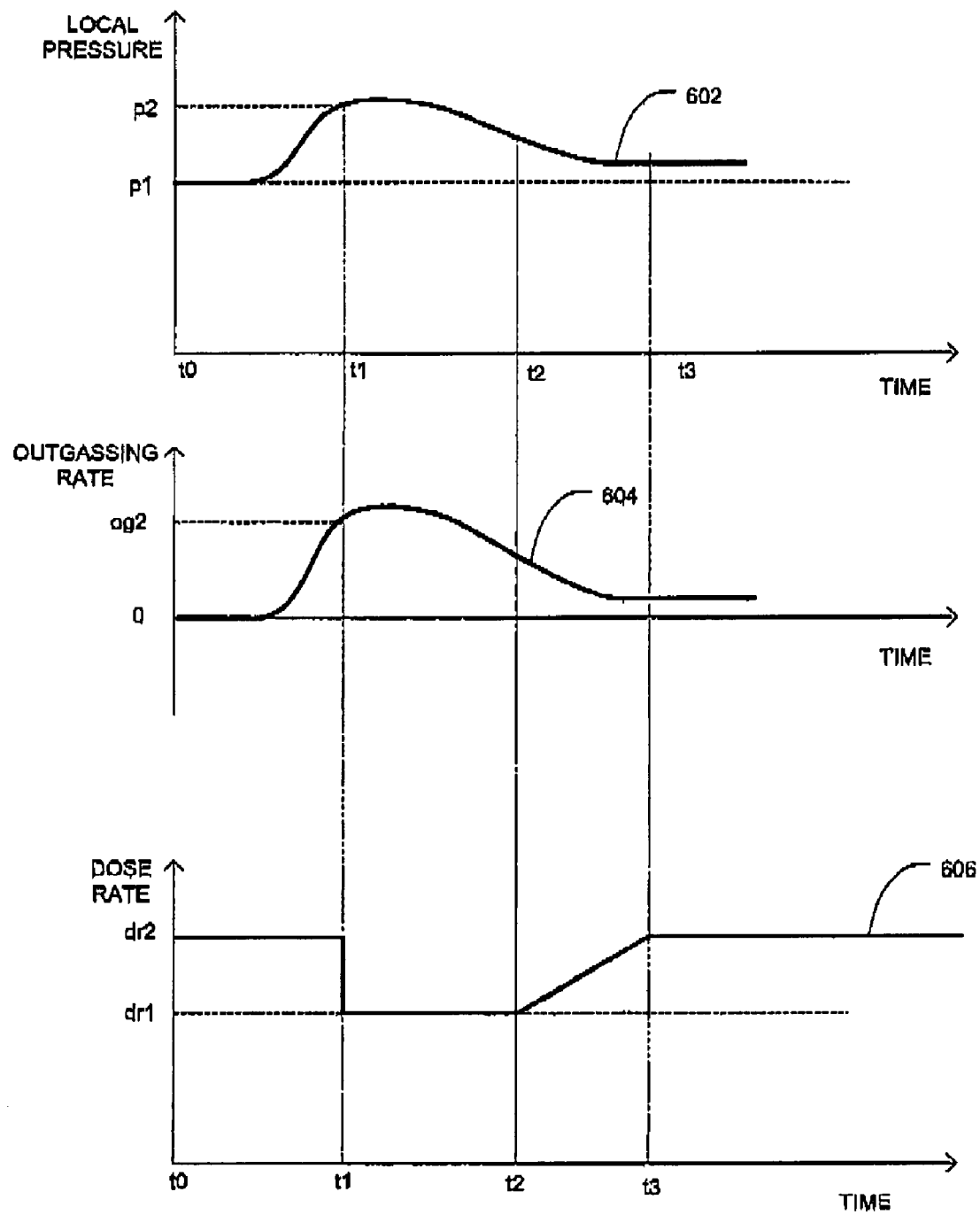
FIG. 6 illustrates plots of a detection signal versus time and an outgassing rate and dose rate over a similar time period.

FIG. 6 illustrates a plot 602 of a detection signal that may be provided by the detector 162 over particular time period. A plot 604 of an outgassing rate of the outgassing byproducts 190 and a plot 606 of dose rate for an ion implanter over the same time period are also illustrated. In one embodiment, the detection signal may be a voltage signal. The voltage signal may have a maximum voltage level (V2) indicating that substantially no portion of the electromagnetic wave 165 is absorbed and/or deflected by any outgassing byproducts 190 between times t0 and t1. Hence the corresponding outgassing rate is effectively zero over the same time period and the dose rate may be at a maximum dose rate (dr2).

As illustrated by plot 602, the detection signal may be at a desired voltage level (V2) and then decrease until it reaches a threshold level (V1) at time t2. As illustrated by plot 604, the decrease in the detection signal is representative an increase in the outgassing rate from the wafer 120 over the same time period. The threshold voltage level (V1) may be selected to be associated with a high outgassing rate (og2). In response, the controller 146 may control the dose rate of an implanter by reducing the dose rate from an initial maximum dose rate (dr2) to a comparatively lower dose rate (dr1) at time t2. In one embodiment, the controller 146 may control the dose rate by controlling the duty factor of a pulsed DC voltage signal provided to the platen 114, e.g., by the bias source 272. In one example, the duty factor may be lowered by about 20% to 30% from its initial value at the maximum dose rate (dr2). The controller 146 may then maintain the dose rate at the lower dose rate (dr1) for a particular delay period or until time t3 to give the outgassing time to dissipate relative to the high outgassing rate (og2). The controller 146 may then start to ramp up the dose rate back to its maximum value (dr2) at time t4.

Advantageously, the detector 162 receives at least a portion of the electromagnetic wave 164 that is representative of an outgassing rate of the outgassing byproducts 190. In an ion implanter, the dose rate can then be modulated in response to the outgassing rate. This enables improvements in throughput as the dose rate can be maximized as long as the detection signal is indicative of a relatively lower outgassing rate. In addition, the dose rate can be lowered if the detection signal is indicative of a relatively higher outgassing rate to control problems such as contamination and dose repeatability issues. Lowering the dose rate in a plasma doping implanter can also control arcing problems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma processing system comprising:
    a process chamber;
    a source configured to generate a plasma in the process chamber;
    a platen configured to support a workpiece in the process chamber;
    a gas pressure sensor positioned adjacent to the workpiece, the gas pressure sensor configured to monitor a local pressure adjacent to the workpiece;
    a bias source configured to bias the platen to accelerate ions from the plasma into the workpiece; and
    a shield ring disposed around the platen, wherein the pressure sensor is positioned within the shield ring and is configured to monitor the local pressure during the acceleration of ions from the plasma into the workpiece.

2. The plasma processing system of claim 1, wherein the shield ring has an interior cavity and an opening from the interior cavity to a location on an exterior surface of the shield ring, wherein the gas pressure sensor is positioned within the interior cavity.

3. The plasma processing system of claim 1, wherein the shield ring has an interior cavity, a first opening from the interior cavity to a first location on an exterior surface of the shield ring, and a second opening from the interior cavity to a second location on the exterior surface of the shield ring, wherein the gas pressure sensor is positioned within the interior cavity.

4. The plasma processing system of claim 1, wherein a Faraday sensor is positioned in a recess of the shield ring, and wherein the shield ring has an interior cavity and an opening from the interior cavity to a location proximate the Faraday sensor, wherein the gas pressure sensor is positioned within the interior cavity.

5. The plasma processing system of claim 1, further comprising a controller configured to receive a sensor signal from the gas pressure sensor representative of the local pressure, the controller further configured to compare the local pressure with a desired pressure, wherein the comparison is representative of an outgassing rate from the workpiece.

6. The plasma processing system of claim 5, wherein the controller is further configured to control a dose rate of the ions by controlling the bias source in response to the comparison of the local pressure to the desired pressure.

7. The plasma processing system of claim 6, wherein the controller is configured to lower the dose rate from a maximum dose rate if the local pressure exceeds a threshold pressure.

8. The plasma processing system of claim 7, wherein the threshold pressure is at least 20% greater than the desired pressure.

9. The plasma processing system of claim 1, wherein the gas pressure sensor is configured to monitor pressure within a pressure range from about 0.1 to 50 millitorr.

10. The plasma processing system of claim 1, wherein the gas pressure sensor has a response time less than about 10 microseconds.

* * * * *